United States Patent [19]
Hirose

[11] Patent Number: 5,172,399
[45] Date of Patent: Dec. 15, 1992

[54] SEMICONDUCTOR CHARGE TRANSFER DEVICE INCLUDING CHARGE QUANTITY DETECTION

[75] Inventor: Satoshi Hirose, Itami, Japan

[73] Assignee: Mitsubishi Denki Kabushiki Kaisha, Tokyo, Japan

[21] Appl. No.: 755,774

[22] Filed: Sep. 6, 1991

[30] Foreign Application Priority Data

Sep. 25, 1990 [JP] Japan .................. 2-258365

[51] Int. Cl.$^5$ .................. G11C 19/28; H01L 29/78
[52] U.S. Cl. .................. 377/60; 257/215
[58] Field of Search .................. 357/24; 377/57–63

[56] References Cited

U.S. PATENT DOCUMENTS

| | | | |
|---|---|---|---|
| 3,918,070 | 11/1975 | Shannon | 357/24 LR |
| 4,074,302 | 2/1978 | Brewer | 357/24 |
| 4,672,645 | 6/1987 | Bluzer et al. | 357/24 LR |
| 4,984,045 | 1/1991 | Matsunga | 357/24 LR |

OTHER PUBLICATIONS

Mutoh et al., "New Low Noise Output Amplifier for HIgh Definition CCD Image Sensor", IEDM 89, pp. 173–176.

Primary Examiner—Gene M. Munson
Attorney, Agent, or Firm—Leydig, Voit & Mayer

[57] ABSTRACT

A charge transfer device includes a signal charge transfer region including a first conductivity type first low dopant concentration semiconductor region on which transfer electrodes are disposed via an insulating film, a charge storage region including a first conductivity type second low dopant concentration semiconductor region connected to the first low dopant concentration semiconductor region, a second conductivity type semiconductor region disposed on the charge storage region, a first conductivity type high dopant concentration semiconductor region disposed at the surface of and spaced from the first conductivity type second low dopant concentration semiconductor region at a region opposite the first conductivity type first low dopant concentration semiconductor region, and a detector for detecting the quantity of signal charges stored in the charge storage region from the resistance value between two points in a portion of said second conductivity type semiconductor region. The charge storage region is completely depleted during the resetting operation, reset noise is eliminated, and S/N ratio is enhanced.

8 Claims, 8 Drawing Sheets

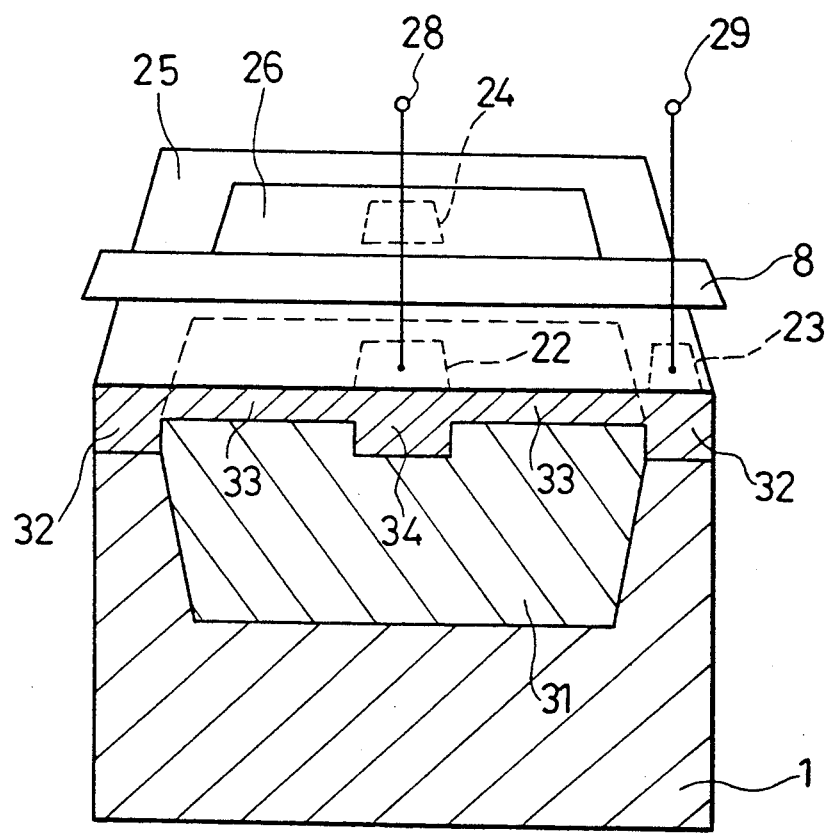
F I G. 2

FIG. 8 (PRIOR ART)
(a)
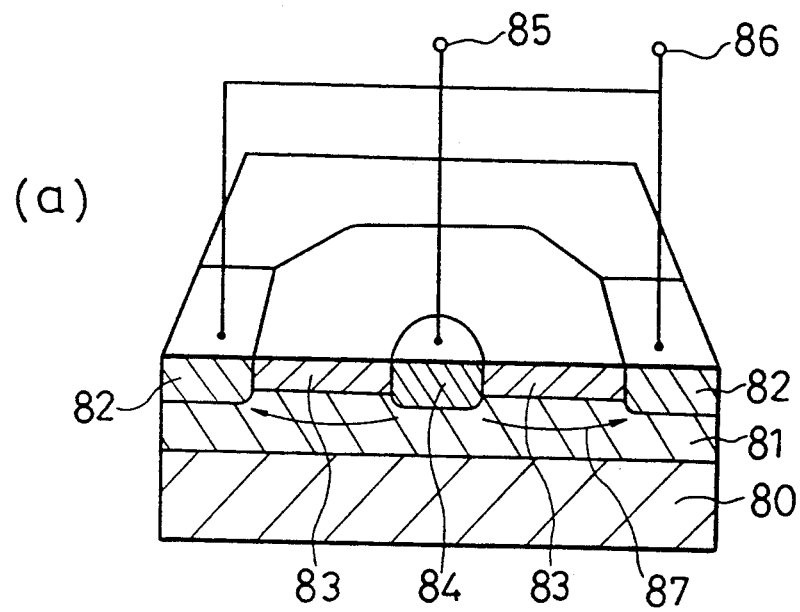
(b)
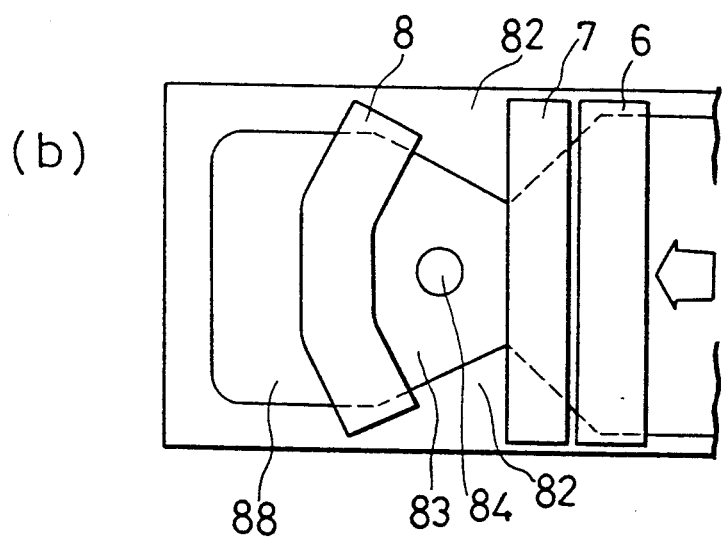
(c)
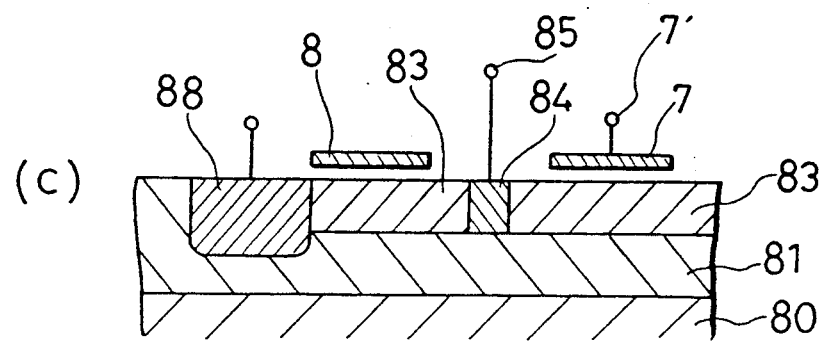

SEMICONDUCTOR CHARGE TRANSFER DEVICE INCLUDING CHARGE QUANTITY DETECTION

FIELD OF THE INVENTION

The present invention relates to a charge transfer device and, more particularly, to a charge transfer device having an improved output portion structure.

BACKGROUND OF THE INVENTION

FIG. 3 is a diagram illustrating the structure of an output portion in a prior art charge transfer device. In FIG. 3, reference numeral 1 designates a p type semiconductor substrate. An n− type semiconductor region 2 serving as a signal charge transfer region is disposed in a predetermined region of the substrate 1. An n+ type semiconductor region 3 serving as a charge storage region is disposed in a predetermined region of the substrate 1 and connected to the n− type semiconductor region 2. An n+ type semiconductor region 5 serving as a reset drain region is disposed in a region of the substrate 1 spaced from the n+ type semiconductor region 3 by a region of the substrate 1 beneath a reset gate 8. A reset drain (RD) terminal 4 is connected to the n+ type semiconductor region 5. To final stage gates 6a and 6b of a CCD driving gate, a final stage input terminal 6' is commonly connected. An output gate terminal 7' is connected to an output gate 7. A silicon dioxide film 9 covers the entire surface of the device. A source follower amplifier 10 comprising enhancement transistors Q1 and Q3 and depletion transistors Q2 and Q4 is connected to the n+ type semiconductor region 3. Reference numerals 11 and 12 designate a signal output terminal and a power supply terminal, respectively, of the source follower amplifier 10.

FIGS. 4(a)–4(d) and 5(a)–5(e) are diagrams explaining the operation of the output portion of the charge transfer device of FIG. 3. FIGS 4(a) to 4(d) are diagrams showing pulse signals applied to each gate of FIG. 3 and the potential variation at the output terminal 11 of the source follower amplifier 10. FIG. 5(a) is a schematic view showing the output portion of FIG. 3 and FIGS. 5(b) to 5(e) are diagrams showing the potential at each region of FIG. 5(a) at times $t_1$ to $t_4$ of FIGS. 4(a)–4(d).

In FIG. 5(a), the same reference numerals as those of FIG. 3 designate the same or corresponding parts. Reference numeral 51 designates signal charges and reference numeral 52 designates an electron. An n+ type semiconductor region 53 corresponds to the n+ semiconductor region 3 described above. Reference numeral 8' designates a reset gate terminal.

A description is given of the operation.

In FIG. 3, signal charges are transferred inside the n− type semiconductor region 2 from right to left synchronized with a clock pulse applied to the CCD gate. Signal charges that have finally reached the n+ type semiconductor region 3 vary the potential of the n+ type semiconductor region 3. The variation of the potential is detected by the source follower amplifier 10 provided on the p type semiconductor substrate 1. When an external voltage is applied to the reset gate 8, signal charges stored in the n+ type semiconductor region 3 are transferred and drained into the n+ type semiconductor region 5, whereby the device is reset.

The above-described operation is accomplished by applying input pulses shown in FIGS. 4(a)–4(d) to respective terminals. FIGS. 5(b) to 5(e) are diagrams illustrating the potential at times $t_1$ to $t_4$, respectively. As shown in FIG. 5(b), charges stored in the n+ type semiconductor region 53, which is going to be reset, flow into the n+ type semiconductor region 5 at time $t_1$. Also following signal charges 51 are stored beneath the final stage driving gate 6a. A constant dc voltage is applied to the output gate terminal 7' so that the potential beneath the output gate 7 does not vary throughout times $t_1$ to $t_4$.

At time $t_2$ when the reset gate terminal 8' is low, the potential against the flow of electrons of the region under the reset gate 8 rises and the potential of the n+ type semiconductor region 53 surrounded by the potential barrier is in a floating state. The potential of the n+ type semiconductor region 53 is affected by the variation of potential of the reset gate 8 via the capacitance from time $t_1$ to $t_2$ and the potential varies from the reset potential $V_R$ to the potential $V_F$ as shown in FIG. 4(a).

At time $t_3$, signal charges 51 are drained into the n+ semiconductor region 53. At this time the final stage driving gate terminal 6' is low. The potential of the n+ semiconductor region 53 takes a value corresponding to the amount of signal charges. Then, the variation in the potential is detected by the source follower amplifier 10 of FIG. 3.

At time $t_4$, the potential returns to the reset state of time $t_1$.

The output portion of the charge transfer device having the above described structure involves a problem of reset noise which inevitably occurs during the reset operation.

As shown in FIGS. 5(b) and 5(e), at the time of reset ($t_1$ and $t_4$), signal charges at the n + type semiconductor region 53 are not completely transferred to the reset drain region 5, and this causes the potential of the region 53 to fluctuate after the reset operation. This fluctuation produces a fluctuation of $V_R$ shown in FIG. 4(a), which results in noise. The cause of incomplete resetting of signal charges resides in the region 53 having a high dopant concentration. When the dopant concentration of the region 53 is lowered, enabling a complete charge depletion of the region 53, the variation of the potential $V_R$ and accordingly the reset noise can be eliminated.

However, in the prior art structure in which a wiring contact to the region 53 is made via a contact hole, charges are supplied from the input gate electrode of the source follower amplifier 10. Therefore, it is impossible to realize complete depletion.

FIGS. 8(a) to 8(c) are a perspective view partially sectioned a plan view, and a cross-sectional view, respectively, illustrating another prior art charge transfer device which reduces reset noise, disclosed in IEDM, 1989, pp.173 to 176. In the figures, reference numeral 80 designates an n type semiconductor substrate. A p-well 81 is formed in the substrate 80 and an n− type semiconductor charge storage region 83 is formed thereon surrounded by a p+ type semiconductor region 82. A drain terminal 86 and a source terminal 85 are connected to the p+ type semiconductor region 82 and a p+ type semiconductor region 84, respectively. Reference numeral 87 designates a hole current.

In the prior art device, the dopant concentration of the charge storage region 83 is lowered so as to enable complete depletion of this region. Electrodes 85 and 86 for reading signals are not directly connected to the charge storage region 83. Instead, it is constructed such that the amount of the stored charge at the charge storage region 83 changes the width of the depletion layer that is produced in the vicinity of the boundary between the charge storage region 83 and the p type well 81 beneath the region 83 and that is detected by the current flowing in a channel comprising the depletion layer, between the p+ type semiconductor region 82 and the p+ type semiconductor region 84. In other words, the signal charges are detected from the current flowing in the FET comprising the charge storage region 83 serving as a ring-junction-gate, the p+ type semiconductor region 82 serving as a source, and the p+ type semiconductor region 84 serving as a drain. Accordingly, charges are not supplied from the electrode during the reset operation and the charge storage region is completely depleted, thereby reducing the reset noise.

Thus, in the second prior art charge transfer device, a p-well structure is required for producing an FET which detects the amount of signal charges, resulting in a structure that is extremely complicated.

SUMMARY OF THE INVENTION

It is an object of the present invention to provide a charge transfer device that can detect the amount of signal charges without contacting the charge storage region, that can completely reset the signal charge storage region, and that can eliminate reset noise.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to the present invention, a charge transfer device includes a charge storage region comprising a first conductivity type low dopant concentration semiconductor region connected to another first conductivity type low dopant concentration semiconductor region serving as a charge transfer region, and a second conductivity type semiconductor region provided on the charge storage region, and the quantity of signal charges stored in the charge storage region is detected from the resistance value of the second conductivity type semiconductor region. The resistance varies corresponding to the quantity of signal charges stored in the charge storage region. Therefore, the charge storage region can be completely depleted during the reset operation, thereby eliminating the noise caused by fluctuation of the reset potential.

BRIEF DESCRIPTION OF THE DRAWINGS

FIG. 2 is a perspective view having a cross-section taken along a line II—II of the FIG. 1(b);

FIGS. 8(a) to 8(c) are a perspective view partially in section, a plan view, and a cross-sectional view, respectively, illustrating another prior art charge transfer device.

DETAILED DESCRIPTION OF THE PREFERRED EMBODIMENTS

An embodiment of the present invention will be described in detail with reference to the drawings.

Figure 1:
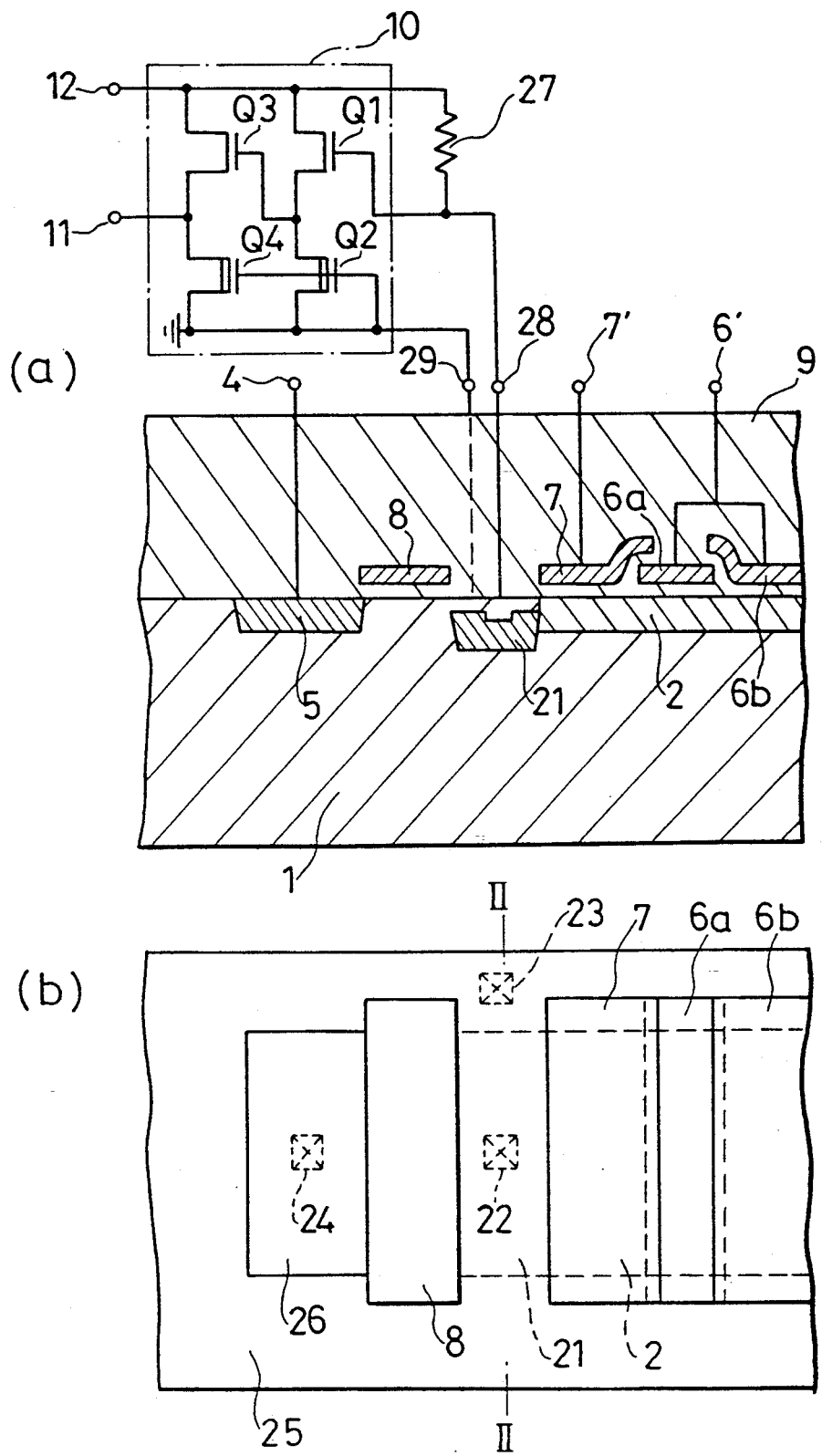
FIGS. 1(a) and 1(b) are a cross-sectional view and a plan view, respectively, illustrating the structure of the vicinity of the output portion in a charge transfer device in accordance with an embodiment of the present invention.
Figure 3:
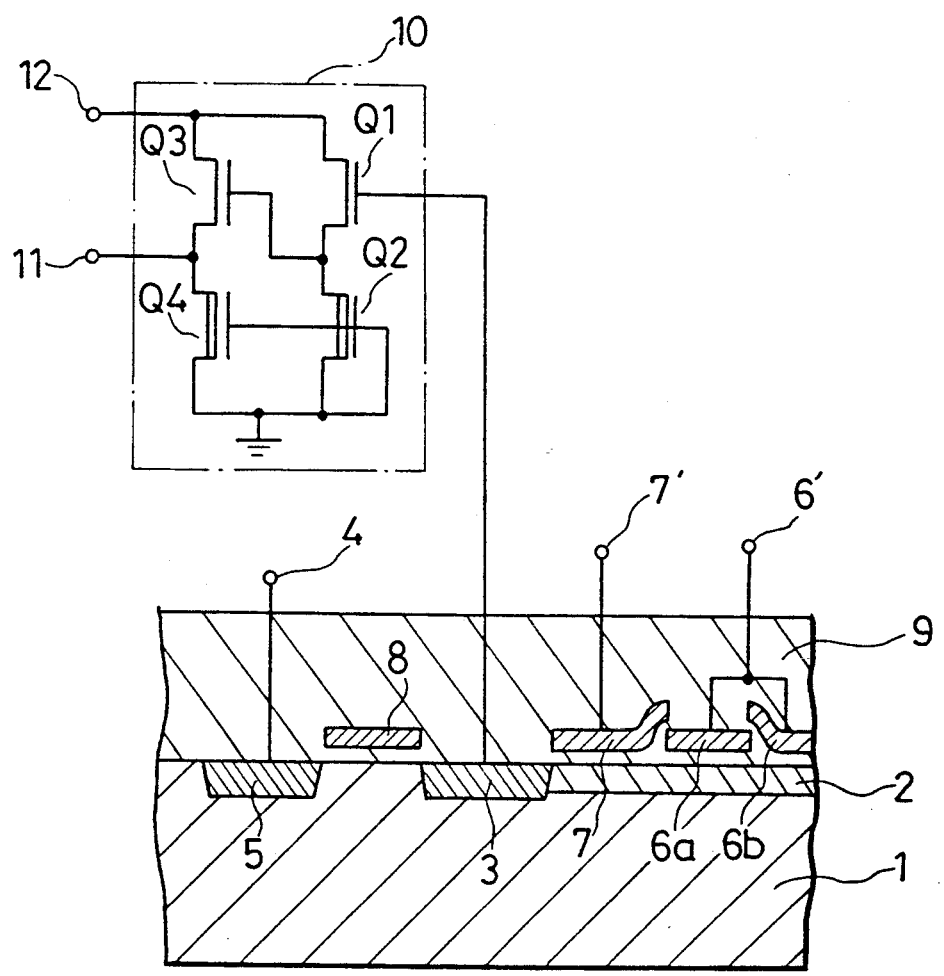
FIG. 3 is a diagram illustrating the structure of the output portion of a prior art charge transfer device.

FIG. 1(a) is a cross-sectional view illustrating the structure of an output portion in a charge transfer device according to an embodiment of the present invention. In FIG. 1(a), the same reference numerals as those of FIG. 3 designate the same or corresponding parts. An $n^-$ type region 21 is connected to an $n^-$ type semiconductor region 2 serving as a signal transfer region and a partial region of the p type semiconductor substrate 1 is disposed on the $n^-$ type region 21. The first electrode 28 is connected to the p type semiconductor region on the $n^-$ type region 21 and the second electrode 29 is connected to a part of the p type semiconductor region 1 on the $n^-$ type region 21 or a part of the p type semiconductor region adjacent thereto in such a manner that a current path comprising a part of the p type semiconductor region on the $n^-$ type region 21 is disposed between the first electrode 28 and the second electrode 29. A load resistance 27 is connected to between the first electrode 28 and a power supply terminal 12 of the source follower amplifier 10.

FIG. 1(b) is a plan view of the charge transfer device of FIG. 1(a). In FIG. 1(b), the same reference numerals as those of FIG. 1(a) designate the same parts. Contact holes 22, 23, and 24 are produced in a silicon dioxide film 9 for providing the first electrode 28, the second electrode 29, and a reset drain terminal 4, respectively. Reference numeral 25 designates a p+ type semiconductor isolating region. An n+ type semiconductor region 26 correspond to the n+ type semiconductor region 5 of FIG. 1(a).

FIG. 2 is a perspective view including a section taken along a line II—II of FIG. 1(b). In FIG. 2, an $n^-$ type semiconductor region 31 corresponds to the $n^-$ type semiconductor region 21 serving as a charge storage region of FIG. 1(a). A p+ type semiconductor region 32 corresponds to the p+ type isolating region 25 of FIG. 1(b). A p type semiconductor region 33 is disposed on the $n^-$ type semiconductor region 31. A p+ type semiconductor region 34 for producing a contact with the first electrode 28 is disposed at the center of the p type semiconductor region 33.

A description is given of the operation.

Figure 4:
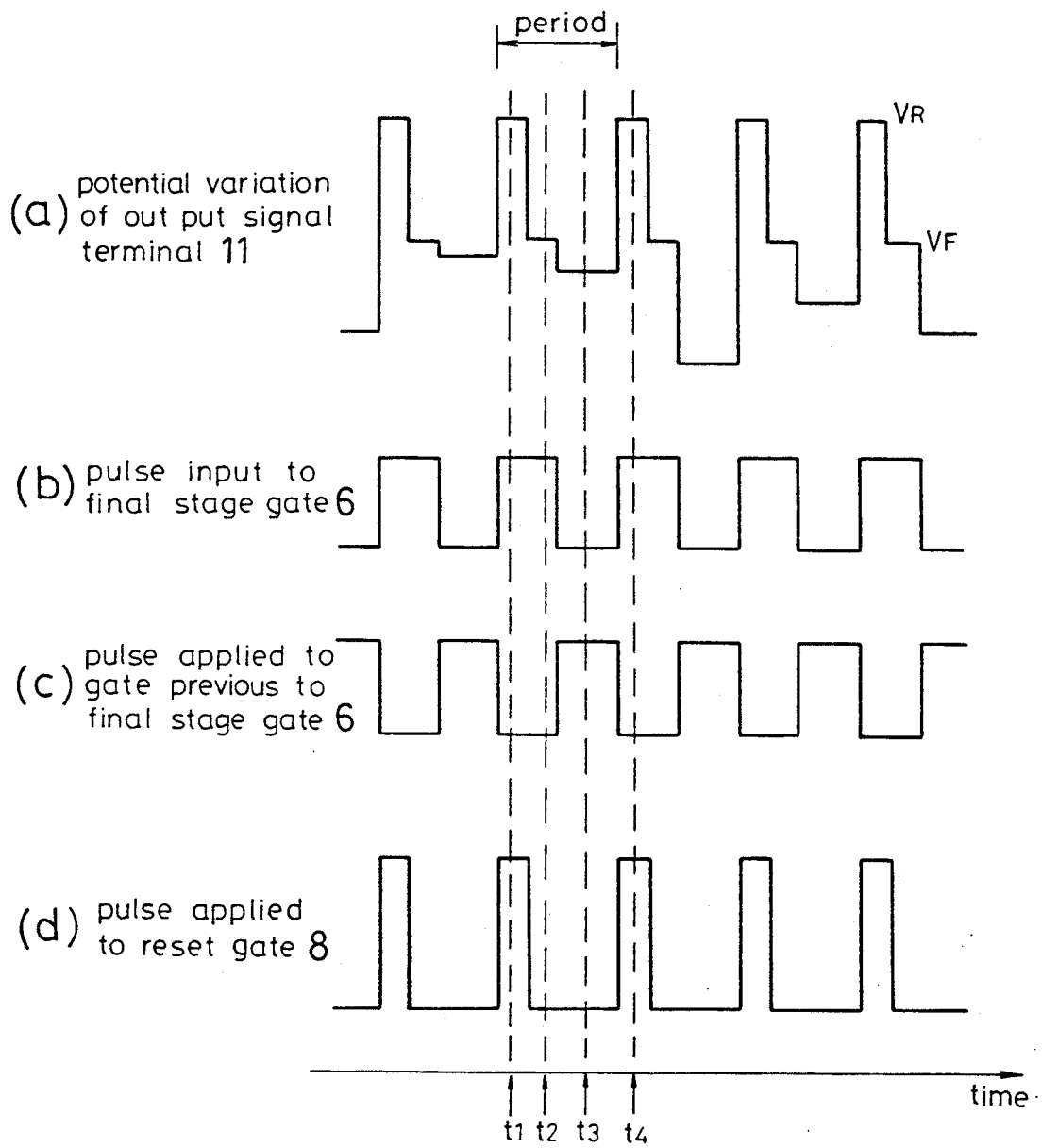
FIGS. 4(a) to 4(d) are diagrams showing waveforms of signals applied to respective gates for the charge transfer or resetting and a waveform of an output signal.
Figure 5:
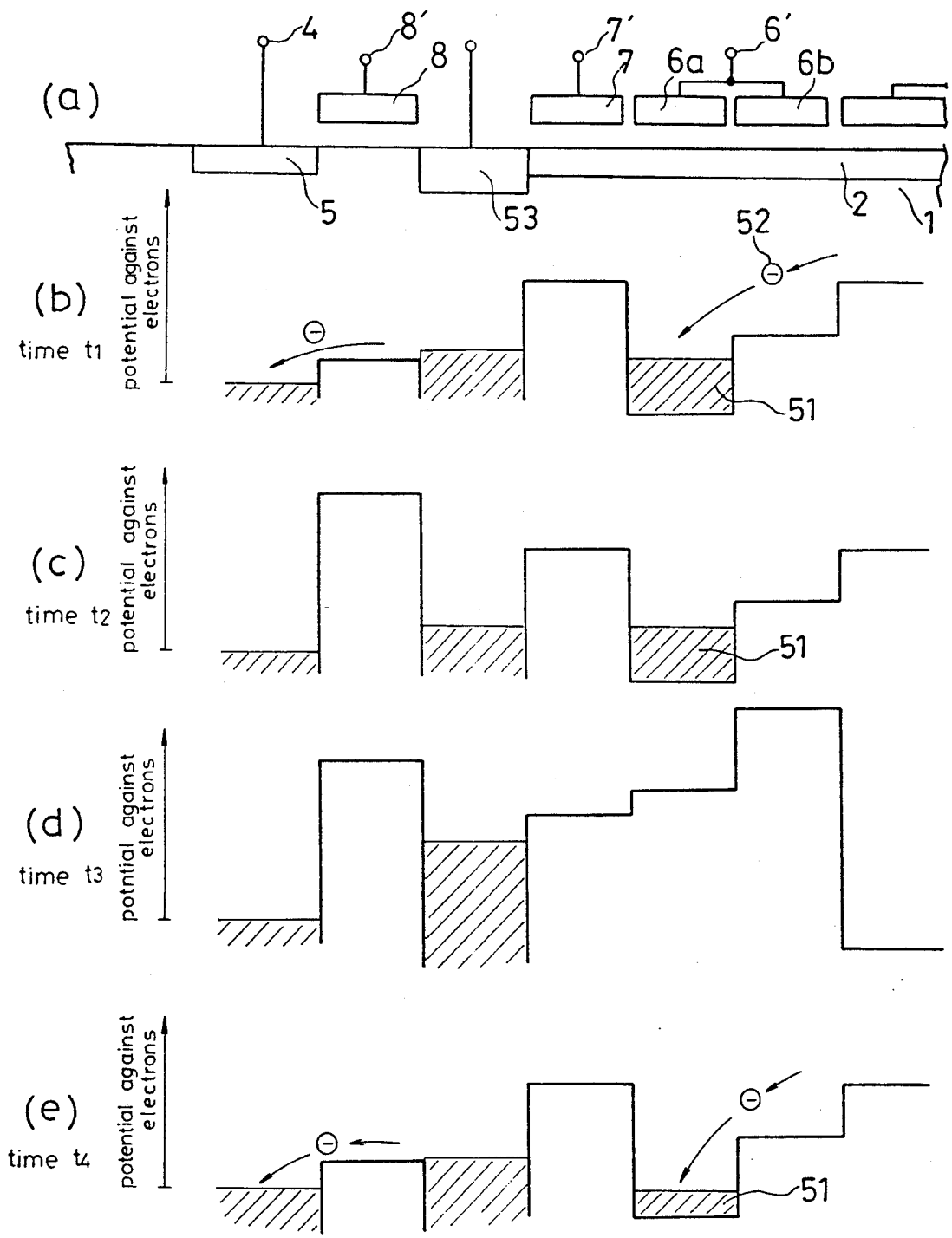
FIG. 5(a) is a schematic diagram illustrating the vicinity of an output portion of a prior art charge transfer device.
FIGS. 5(b) to 5(e) are diagrams illustrating potentials of respective regions thereof at the times $t_1$ to $t_4$ of FIGS. 4(a)-4(d)

In the charge transfer device of this embodiment, the same pulse signals as those of the prior art device are applied to respective gates for charge transfer and resetting. That is, pulse signals having waveforms shown in FIGS. 4(b) to 4(d) are applied to respective gates with the same timing.

Figure 6:
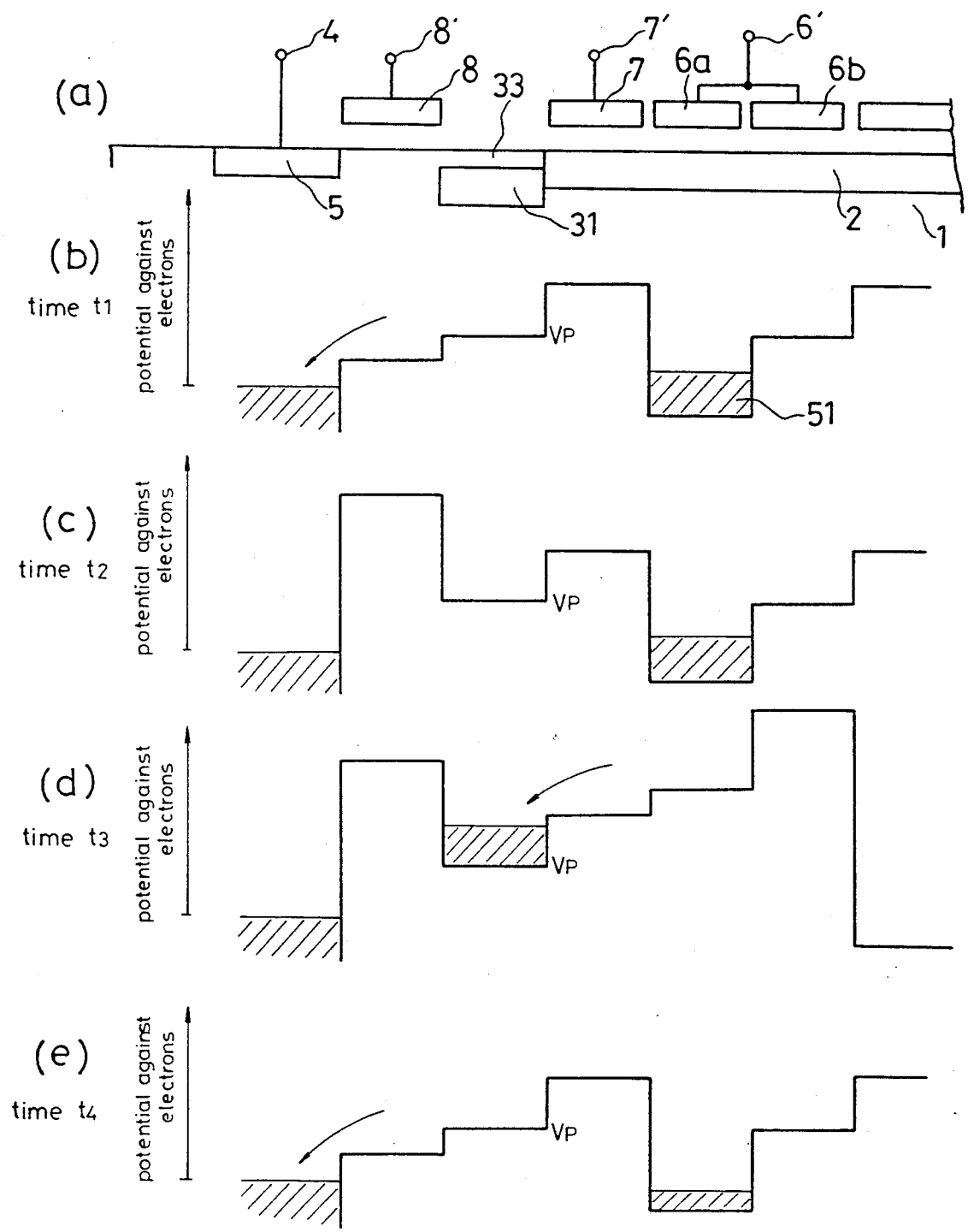
FIG. 6(a) is a schematic diagram illustrating the vicinity of an output portion of a charge transfer device in accordance with an embodiment of the present invention and FIGS. 6(b) to 6(e) are diagrams illustrating potentials of respective regions thereof at times $t_1$ to $t_4$ of FIGS. 4(a)-4(d)

FIG. 6(a) is a schematic view illustrating the vicinity of the output portion of the charge transfer device according to an embodiment of the present invention and FIGS. 6(b) to 6(e) are diagrams showing the potentials of respective regions at times $t_1$ to $t_2$ of FIGS. 4(a)-4(d).

As shown in FIG. 6(b), charges stored in the $n^-$ type semiconductor region 31 are transferred into the $n^+$ type semiconductor region 5 at the reset drain side at time $t_1$. Since the dopant concentration of the $n^-$ type semiconductor region 31 is low, all charges stored in the region are transferred and the $n^-$ type semiconductor region 31 is completely depleted as shown in the figure. The potential $V_P$ then obtained is determined by the size and dopant concentration of the $n^-$ type semiconductor region 31 and the dopant concentration of the p type semiconductor region around the $n^-$ type semiconductor region 31.

As shown in FIG. 6(c), the $n^-$ type semiconductor region 31 is still depleted at time $t_2$ when the reset gate 8 is turned off.

At time $t_3$, charges are transferred and drained into the $n^-$ type semiconductor region 31 from the CCD side, so that the potential of the $n^-$ type semiconductor region 31 rises up, as shown in FIG. 6(d). The resistance of the p type semiconductor region 33 varies according to the variation of the potential of the $n^-$ semiconductor region 31, whereby the quantity of signal charges is detected in the device of this embodiment.

As shown in FIG. 6(e), the potentials of respective regions are again in reset states at time $t_4$ similarly as at time $t_1$. In this embodiment, a complete reset is accomplished and reset noise is eliminated.

A description is given of an operation for detecting the potential variation that is, the signal detecting operation.

Figure 7:
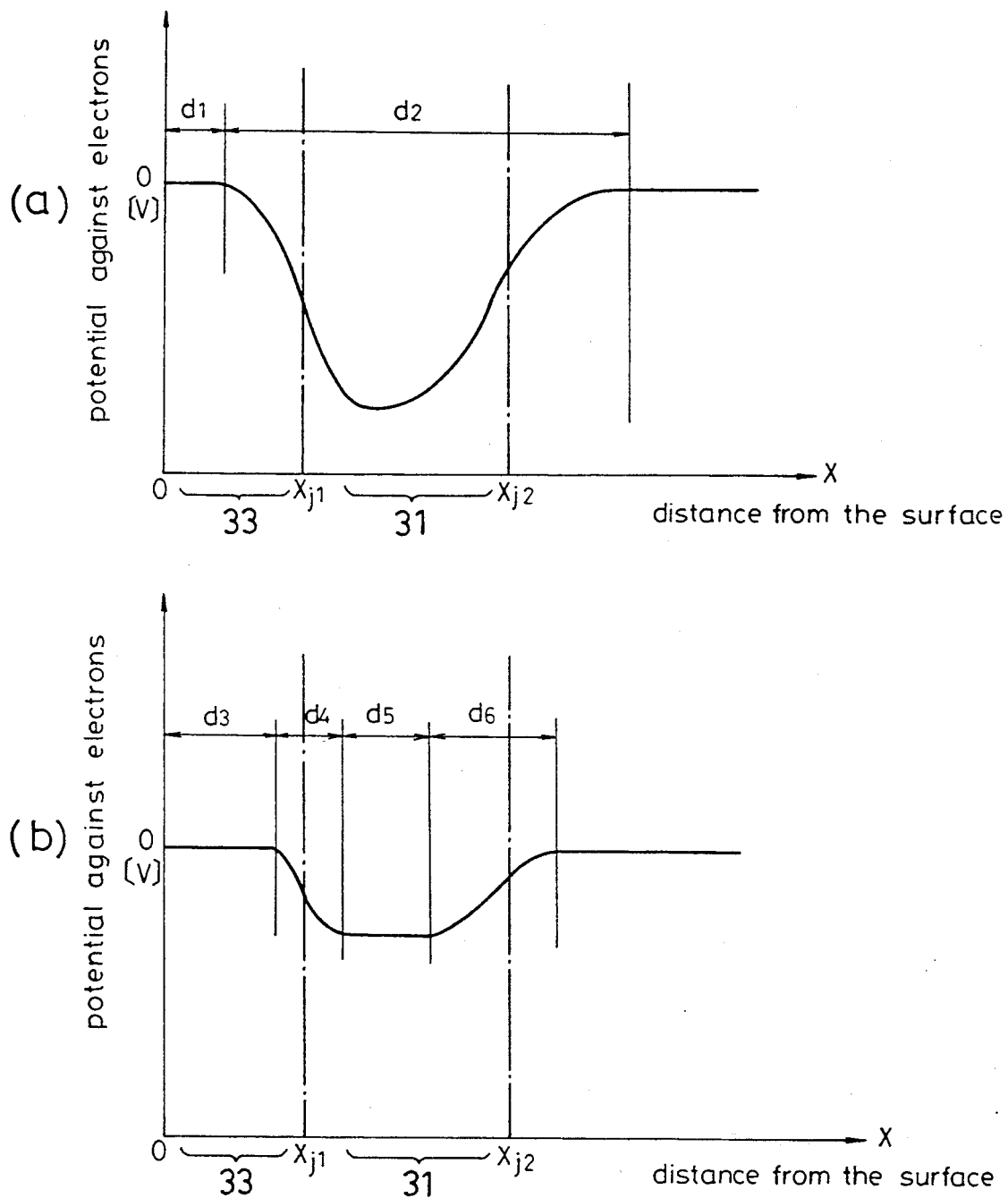
FIGS. 7(a) and 7(b) are diagrams explaining the operation principle of signal detection according to the present invention.

FIGS. 7(a) and 7(b) are diagrams for explaining the operating principle of this embodiment. In these figures, the potentials relative to electrons of the $n^-$ type semiconductor region 31, p type semiconductor region 33, and p type semiconductor substrate 1 of FIG. 2 are illustrated. The abscissa is the distance from the surface (crystal depth). FIG. 7(a) shows the potential where no signal charge exists in the region 31, while FIG. 7(b) shows the potential where signal charges exist in the region 31. In FIGS. 7(a) and 7(b), the region of $0 < X < X_{j1}$ corresponds to the p type semiconductor region 33, the region of $X_{j1} < X < X_{j2}$ to the $n^-$ type semiconductor region 31, and the region of $X_{j2} < X$ to the p type semiconductor substrate 1.

The region 21 of FIG. 1(a) is a region for storing signal charges similarly as the region 31 of FIG. 2. When the reset gate 8 is turned on, the charges stored in the region 31 are thoroughly transferred and drained into the $n^+$ type semiconductor region 5(26) at the reset drain side, whereby the region 31 is completely depleted. The potential of the $n^-$ type semiconductor region 31 at this time is shown in FIG. 7(a).

In FIG. 7(a), the range denoted by $d_2$ is a depletion region. The range denoted by $d_1$ is a non-depleted portion in the p type semiconductor region 33. When signal charges drain into the $n^-$ type semiconductor region 31, the potential changes into the state as shown in FIG. 7(b). In FIG. 7(b), signal charges exist in the region denoted by $d_5$.

Since the region of $X_{j1} < X < X_{j2}$ is a region comprising $n^-$ type semiconductor, positive fixed charges (donors) remain in the region in a depleted state. However, when electrons (negative charges) as signal charges drain into the region, a portion denoted by $d_5$ in the region of $X_{j1} < X < X_{j2}$ is neutralized. Accordingly, the potential of the region $d_5$ is represented by a straight line in FIG. 7(b). Compared to FIG. 7(a), the width of the region of positive fixed charges which are not neutralized in the region 31, that is, the width of the depletion regions $d_4$ and $d_6$ is narrow. The region denoted by $d_3$ of FIG. 7(b) corresponds to a non-depleted portion in the p type semiconductor region 33.

In FIG. 2, when a voltage is applied between the first electrode 28 and the second electrode 29, the non-depleted region in the p type semiconductor region 33 serves as a current path. The distance of the current path in the crystal depth direction varies between $d_1$ and $d_3$ when charges exist in the $n^-$ type semiconductor region 31 and when they do not exist as shown in FIGS. 7(a) and 7(b). When no charges exist in the $n^-$ type semiconductor region 31, the width of current path $d_1$ is narrow and the resistance of the region 33 is high. On the other hand, when signal charges exist in the $n^-$ type semiconductor region 31, the width of the current path $d_3$ is wide and the resistance of the region 33 is low.

In the above-described embodiment, the amount of charges existing in the region 31 can be detected using the variation of the current flowing in the region 33 without contacting the region 31. Accordingly, it is not necessary that an electrode contact the region 31 via a contact hole as in the prior art device. Accordingly, the impurity concentration of the region 31 can be lowered. In addition, since charges are not supplied from the outside, a complete depletion is accomplished for the region 31 in the reset operation. Therefore, the signal-to-noise ratio (S/N) of the device can be enhanced with a simple structure.

While in the above-described embodiment, the charge transfer device is produced on the p type semiconductor substrate, it may be produced on a p type semiconductor region that is produced on an n type semiconductor substrate.

The source follower amplifier 10, the arrangement of which is not explained in detail in the above-described embodiment, may be present on the same semiconductor substrate on which the charge transfer device is formed, or may be an external circuit.

As is evident from the foregoing description, according to the present invention, a charge transfer device includes a charge storage region comprising a first conductivity type low dopant concentration semiconductor region which is connected to another first conductivity type low dopant concentration semiconductor region serving as a charge transfer region, and a second conductivity type semiconductor region formed on the charge storage region. The quantity of signal charges stored in the charge storage region is detected from the resistance of the second conductivity type semiconductor region which varies in response to the above-described signal charge amount without contacting the charge storage region. Therefore, the charge storage region is completely depleted in the reset operation, thereby realizing a charge transfer device having a simple structure that eliminates noise caused by fluctuation of the reset potential and enhances the signal-to-noise ratio.

What is claimed is:
1. A charge transfer device comprising:
   a p type semiconductor substrate having a surface, an insulating layer disposed on the surface, said substrate including a signal charge transfer region comprising a plurality of transfer electrodes disposed on said insulating film and an n type low dopant concentration semiconductor region in said substrate at the surface, said transfer electrodes being disposed opposite said n type low dopant concentration region;

a charge storage region in said substrate spaced from the surface comprising an n type low dopant concentration semiconductor region connected to said n type low dopant concentration semiconductor region;

a p type semiconductor region disposed on said charge storage region;

an n type high dopant concentration semiconductor region disposed in said substrate at the surface opposite said signal charge transfer region and spaced apart from said charge storage region; and means for detecting the quantity of signal charges stored in said charge storage region from the resistance between two points of said p type semiconductor region, the resistance varying in accordance with the quantity of said signal charges stored in said charge storage region.

2. The charge transfer device of claim 1 wherein said means for detecting the quantity of signal charges comprises:

first and second electrodes disposed on said p type semiconductor region;

a resistance load connected between said first electrode and a power supply terminal for converting a flowing current into a voltage; and a source follower amplifier receiving a signal from said first electrode as an input signal wherein the second electrode is grounded.

3. The charge transfer device of claim 1 including a reset gate disposed on the substrate between said charge storage region and said n type high dopant concentration semiconductor region wherein charges stored in said charge storage region are transferred into said n type high dopant concentration semiconductor region via said substrate between said charge storage region and said n type high dopant concentration semiconductor region.

4. The charge transfer device of claim 1 wherein the width of a depletion region at an interface between said p type semiconductor region and said charge storage region is reduced and the resistance value between said two points is lowered by charges stored in said charge storage region.

5. A charge transfer device comprising:

a semiconductor substrate of a first conductivity type having a surface, an insulating layer disposed on the surface, said substrate including a signal charge transfer region comprising a plurality of transfer electrodes disposed on said insulating film and a first low dopant concentration semiconductor region of a second conductivity type opposite the first conductivity type in said substrate at the surface, said transfer electrodes being disposed opposite said first low dopant concentration region of the second conductivity type;

a charge storage region in said substrate spaced from the surface comprising a second low dopant concentration semiconductor region of the second conductivity type connected to said first low dopant concentration semiconductor region of the second conductivity type;

a semiconductor region of the first conductivity type disposed on said charge storage region;

a high dopant concentration semiconductor region of the second conductivity type disposed in said substrate at the surface opposite said signal charge transfer region and spaced apart from said charge storage region; and means for detecting the quantity of signal charges stored in said charge storage region from the resistance between two points of said semiconductor region of the first conductivity type, the resistance varying in accordance with the quantity of said signal charges stored in said charge storage region.

6. The charge transfer device of claim 5 wherein said means for detecting the quantity of signal charges comprises:

first and second electrodes disposed on said semiconductor region of the first conductivity type;

a resistance load connected between said first electrode and a power supply terminal for converting a flowing current into a voltage; and a source follower amplifier receiving a signal from said first electrode as an input signal wherein the second electrode is grounded.

7. The charge transfer device of claim 5 including a reset gate disposed on said substrate between said charge storage region and said high dopant concentration semiconductor region of the second conductivity type wherein charges stored in said charge storage region are transferred into said high dopant concentration semiconductor region of the second conductivity type via said substrate between said charge storage region and said high dopant concentration semiconductor region of the second conductivity type.

8. The charge transfer device of claim 5 wherein the width of a depletion region at an interface between said semiconductor region of the first conductivity type and said charge storage region is reduced and the resistance value between said two points in lowered by charges stored in the charge storage region.

* * * * *